US012777706B2

(12) United States Patent
Chen et al.

(10) Patent No.: US 12,777,706 B2
(45) Date of Patent: Oct. 27, 2026

(54) SEMICONDUCTOR DEVICE HAVING PLANAR TRANSISTOR AND FINFET

(71) Applicant: TAIWAN SEMICONDUCTOR MANUFACTURING CO., LTD., Hsinchu (TW)

(72) Inventors: Wei-Barn Chen, Tainan City (TW); Ting-Huang Kuo, Tainan City (TW); Shiu-Ko Jangjian, Tainan City (TW); Chi-Cherng Jeng, Tainan City (TW); Kuang-Yao Lo, Tainan City (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 332 days.

(21) Appl. No.: 18/662,772

(22) Filed: May 13, 2024

(65) Prior Publication Data

US 2024/0297079 A1 Sep. 5, 2024

Related U.S. Application Data

(63) Continuation of application No. 17/740,241, filed on May 9, 2022, now Pat. No. 12,009,262, which is a (Continued)

(51) Int. Cl.

| | |
|---|---|
| ***H10D 84/03*** | (2025.01) |
| ***H10D 62/13*** | (2025.01) |
| ***H10D 64/01*** | (2025.01) |
| ***H10D 84/01*** | (2025.01) |
| ***H10D 84/83*** | (2025.01) |
| ***H10P 30/20*** | (2026.01) |
| ***H10P 50/00*** | (2026.01) |

(52) U.S. Cl.
CPC ......... *H10D 84/038* (2025.01); *H10D 62/151* (2025.01); *H10D 64/017* (2025.01); (Continued)

(58) Field of Classification Search
CPC .. H10D 84/038; H10D 62/151; H10D 64/017; H10D 84/0128; H10D 84/0151; (Continued)

(56) References Cited

U.S. PATENT DOCUMENTS

| | | | |
|---|---|---|---|
| 7,126,199 | B2 | 10/2006 | Doczy et al. |
| 8,569,135 | B2 | 10/2013 | Guo et al. |

(Continued)

FOREIGN PATENT DOCUMENTS

| | | | |
|---|---|---|---|
| CN | 1805124 | A | 7/2006 |
| CN | 101027770 | A | 8/2007 |

(Continued)

*Primary Examiner* — Andres Munoz
(74) *Attorney, Agent, or Firm* — Maschoff Brennan

(57) ABSTRACT

A device includes a FinFET on a first region of a substrate and a planar-FET on a second region of the substrate. The FinFET includes a FinFET source region, a FinFET drain region, and a FinFET gate between the FinFET source region and the FinFET drain region. The planar-FET includes a planar-FET source region, a planar-FET drain region, and a planar-FET gate between the planar-FET source region and the planar-FET drain region. A bottommost position of the FinFET source region is lower than a bottommost position of the planar-FET source region.

20 Claims, 12 Drawing Sheets

Related U.S. Application Data continuation of application No. 17/079,052, filed on Oct. 23, 2020, now Pat. No. 11,328,958, which is a continuation of application No. 16/687,605, filed on Nov. 18, 2019, now Pat. No. 10,818,555, which is a continuation of application No. 15/678,097, filed on Aug. 15, 2017, now Pat. No. 10,483,167.

(52) U.S. Cl.
CPC ..... *H10D 84/0128* (2025.01); *H10D 84/0151* (2025.01); *H10D 84/0158* (2025.01); *H10D 84/834* (2025.01); *H10P 30/204* (2026.01); *H10P 30/21* (2026.01); *H10P 50/694* (2026.01); *H10P 50/695* (2026.01); *H10D 84/013* (2025.01); *H10D 84/0147* (2025.01)

(58) Field of Classification Search
CPC ............. H10D 84/0158; H10D 84/834; H10D 84/013; H10D 84/0147; H10D 30/024; H10P 30/204; H10P 30/21; H10P 50/694; H10P 50/695; H10P 76/408
See application file for complete search history.

(56) References Cited

U.S. PATENT DOCUMENTS

| | | | | |
|---|---|---|---|---|
| 9,418,994 | B1 * | 8/2016 | Chao | H10D 30/0243 |
| 9,608,114 | B2 | 3/2017 | Kim et al. | |
| 9,613,960 | B2 | 4/2017 | Li et al. | |
| 9,691,766 | B1 | 6/2017 | Lin et al. | |
| 2005/0093082 | A1 | 5/2005 | Son et al. | |
| 2006/0081895 | A1 | 4/2006 | Lee et al. | |
| 2006/0154426 | A1 | 7/2006 | Anderson et al. | |
| 2006/0202270 | A1 | 9/2006 | Son et al. | |
| 2007/0080387 | A1 | 4/2007 | Liu et al. | |
| 2008/0029821 | A1 | 2/2008 | Yamagami et al. | |
| 2008/0277745 | A1 | 11/2008 | Hsu et al. | |
| 2009/0023261 | A1 | 1/2009 | Hirano | |
| 2009/0090976 | A1 * | 4/2009 | Kavalieros | H10D 30/024 257/E29.264 |
| 2009/0294874 | A1 | 12/2009 | Lee | |
| 2013/0049136 | A1 * | 2/2013 | Wahl | H10D 84/0158 257/E27.06 |
| 2013/0082304 | A1 | 4/2013 | Liu et al. | |
| 2013/0134520 | A1 | 5/2013 | Maeda et al. | |
| 2015/0214370 | A1 * | 7/2015 | Kim | H10D 30/024 257/401 |
| 2015/0364593 | A1 | 12/2015 | Jangjian et al. | |
| 2016/0268434 | A1 | 9/2016 | Ching et al. | |
| 2017/0236841 | A1 | 8/2017 | Song et al. | |

FOREIGN PATENT DOCUMENTS

| | | | |
|---|---|---|---|
| CN | 101303975 | A | 11/2008 |
| CN | 101315892 | A | 12/2008 |
| CN | 103000518 | A | 3/2013 |
| CN | 103035713 | A | 4/2013 |
| CN | 103515283 | A | 1/2014 |

* cited by examiner

SEMICONDUCTOR DEVICE HAVING PLANAR TRANSISTOR AND FINFET

PRIORITY CLAIM AND CROSS-REFERENCE

The present application is a continuation of the U.S. patent application Ser. No. 17/740,241, filed May 9, 2022, which is a continuation of the U.S. patent application Ser. No. 17/079,052, filed Oct. 23, 2020, now U.S. Pat. No. 11,328,958, issued May 10, 2022, which is a continuation of the U.S. patent application Ser. No. 16/687,605, filed Nov. 18, 2019, now U.S. Pat. No. 10,818,555, issued Oct. 27, 2020, which is a continuation of the U.S. patent application Ser. No. 15/678,097, filed Aug. 15, 2017, now U.S. Pat. No. 10,483,167, issued Nov. 19, 2019, all of which are incorporated herein by reference in their entirety.

BACKGROUND

The semiconductor integrated circuit (IC) industry has experienced rapid growth. In the course of the IC evolution, functional density (defined as the number of interconnected devices per chip area) has generally increased while geometry size (i.e., the smallest component (or line) that can be created using a fabrication process) has decreased. A scaling down process generally provides benefits by increasing production efficiency and lowering associated costs. But, such scaling down has increased the complexity of processing and manufacturing ICs. For these advances to be realized, similar developments in IC manufacturing are needed.

For example, as the semiconductor IC industry has progressed into nanometer technology process nodes in pursuit of higher device density, higher performance, and lower costs, challenges from both fabrication and design have resulted in the development of three-dimensional (3D) devices such a fin-like field effect transistors (FinFETs). However, conventional FinFET devices and methods of fabricating the FinFET devices have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
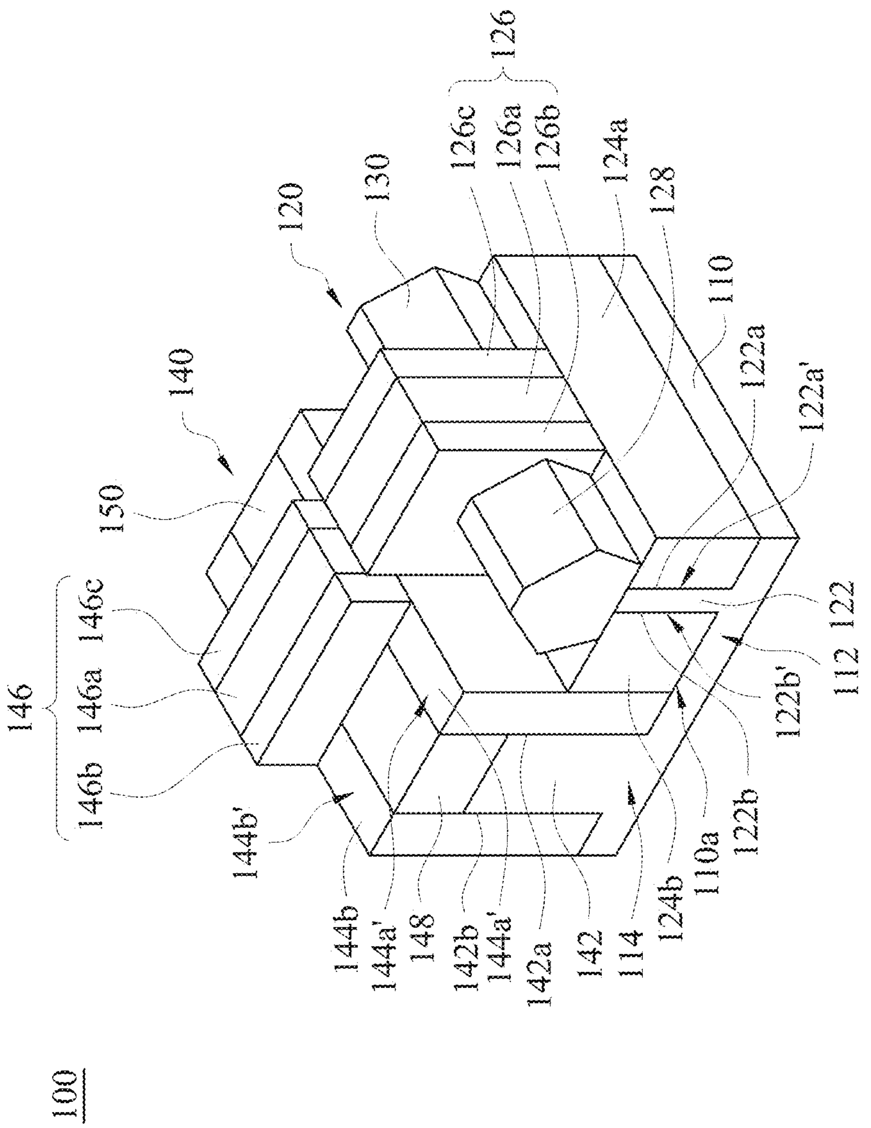
FIG. 1 is schematic perspective drawing of a semiconductor device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term “one” or “the” of the single form may also represent the plural form. The terms such as “first” and “second” are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term “and/or” includes any and all combinations of one or more of the associated listed items.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

A FinFET device is a three-dimensional structure, and a planar metal oxide semiconductor field effect transistor (MOSFET) device is a two-dimensional structure, such that the parasitic capacitance of the FinFET device is greater than the parasitic capacitance of the planar MOSFET device. Therefore, a cut-off frequency (Ft) of the FinFET device is much lower than a cut-off frequency of the planar MOSFET. Typically, the FinFET device and the planar MOSFET device are separately manufactured on two wafers, and the FinFET device and the planar MOSFET device are two individual devices. Therefore, the process of manufacturing an electronic product including both the FinFET device and the planar MOSFET device is complex, and it is unfavorable to the microminiaturizing of the electronic product.

Embodiments of the present disclosure are directed to providing a method for manufacturing a semiconductor device, in which an additional mask layer is used to define multiple MOSFET structures, such that a FinFET structure and a planar FET structure are simultaneously formed on the same substrate. Therefore, the process of manufacturing a semiconductor device including both the FinFET structure and the planar FET structure is simplified, and the semiconductor device is microminiaturized.

FIG. 1 is schematic perspective drawing of a semiconductor device in accordance with various embodiments. In some embodiments, a semiconductor device 100 is dual MOSFET structure device. The semiconductor device 100 may include a substrate 110, a FinFET structure 120, and a planar FET structure 140. The substrate 110 includes a first region 112 and a second region 114. In some examples, the first region 112 is adjacent to the second region 114. The substrate 110 may be composed of a single-crystalline semiconductor material or a compound semiconductor material. For example, silicon, germanium or glass may be used as a material of the substrate 110. In some exemplary examples, the substrate 110 is composed of silicon.

The FinFET structure 120 is disposed in the first region 112 of the substrate 110. In some examples, the FinFET structure 120 includes at least one fin structure 122, at least two first isolation structures 124*a* and 124*b*, a first gate structure 126, a first source 128, and a first drain 130. The fin structure 122 is disposed on the substrate 110. In some examples, the fin structure 122 is formed by recessing the substrate 110, and thus the fin structure 122 protrudes from a recessed surface 110*a* of the substrate 110, in which the fin structure 122 and the substrate 110 are formed from the same material.

As shown in FIG. 1, the first isolation structures 124*a* and 124*b* are respectively disposed on two opposite sidewalls 122*a* and 122*b* of the fin structure 122 and extend along a direction that the fin structure 122 extends along. The first isolation structures 124*a* and 124*b* respectively cover a lower portion 122*a*' of the sidewall 122*a* and a lower portion 122*b*' of the sidewall 122*b*. In some exemplary examples, the first isolation structures 124*a* and 124*b* are formed from silicon oxide.

The first gate structure 126 extends on a portion of the fin structure 122 and portions of the first isolation structures 124*a* and 124*b*. An extending direction of the first gate structure 126 is different from the extending direction of the fin structure 122. For example, the extending direction of the first gate structure 126 may be perpendicular to that of the fin structure 122. The first gate structure 126 covers upper portions of the sidewalls 122*a* and 122*b* and a top surface of the portion of the fin structure 122, in which the upper portions of the sidewalls 122*a* and 122*b* are respectively located over the lower portion 122*a*' of the sidewall 122*a* and the lower portion 122*b*' of the sidewall 122*b*, and the top surface of the fin structure 122 are connected to the sidewalls 122*a* and 122*b*. In some examples, the first gate structure 126 includes a first gate 126*a* and two first spacers 126*b* and 126*c*. The first spacers 126*b* and 126*c* are disposed on the fin structure 122 and the first isolation structures 124*a* and 124*b*, and are separated from each other. The first gate 126*a* is disposed between the first spacers 126*b* and 126*c* and covers the upper portions of the sidewalls 122*a* and 122*b* and the top surface of the portion of the fin structure 122. In some exemplary examples, the first spacers 126*b* and 126*c* are formed from silicon nitride or silicon oxynitride, and the first gate 126*a* includes a metal layer.

The first source 128 and the first drain 130 are respectively disposed on two opposite sides of the first gate structure 126 and are located on the fin structure 122. The first source 128 and the first drain 130 respectively pass through the first spacers 126*b* and 126*c*. In some exemplary examples, each of the first source 128 and the first drain 130 is an epitaxy structure. For example, the first source 128 and the first drain 130 are formed from epitaxial SiGe.

Referring to FIG. 1 again, the planar FET structure 140 is disposed in the second region 114 of the substrate 110. In some examples, the planar FET structure 140 includes a raised structure 142, two second isolation structures 144*a* and 144*b*, a second gate structure 146, a second source 148, and a second drain 150. The raised structure 142 is disposed on the substrate 110. In some examples, the raised structure 142 is formed by recessing the substrate 110, such that the raised structure 142 protrudes from a recessed surface 110*a* of the substrate 110, and thus the raised structure 142 and the substrate 110 are formed from the same material.

The second isolation structures 144*a* and 144*b* are respectively disposed on two opposite sidewalls 142*a* and 142*b* of the raised structure 142 and extend a direction that the raised structure 142 extends. The second isolation structures 144*a* and 144*b* completely cover the sidewalls 142*a* and 142*b*. In some exemplary examples, the first isolation structures 144*a* and 144*b* are formed from silicon oxide. In some exemplary examples, a top surface of the raised structure 142, which is covered by the second gate structure 146, is substantially aligned with a top surface 144*a*' of the second isolation structure 144*a* and a top surface 144*b*' of the second isolation structure 144*b*.

The second gate structure 146 extends on a portion of the raised structure 142 and portions of the second isolation structures 144*a* and 144*b*. An extending direction of the second gate structure 146 is different from the extending direction of the raised structure 142. For example, the extending direction of the second gate structure 146 may be perpendicular to that of the raised structure 142. The second gate structure 146 covers a top surface of the portion of the raised structure 142, in which the top surface of the raised structure 142 are connected to the sidewalls 142*a* and 142*b*. In some examples, the second gate structure 146 includes a second gate 146*a* and two second spacers 146*b* and 146*c*. The second spacers 146*b* and 146*c* are disposed on the raised structure 142 and the second isolation structures 144*a* and 144*b*, in which the second spacers 146*b* and 146*c* are separated from each other. The second gate 146*a* is disposed between the second spacers 146*b* and 146*c* and covers the top surface of the portion of the raised structure 142. In some exemplary examples, the second spacers 146*b* and 146*c* are formed from silicon nitride or silicon oxynitride, and the second gate 146*a* includes a metal layer.

The second source 148 and the second drain 150 are respectively disposed on two opposite sides of the second gate structure 146 and are located in the raised structure 142. A portion of the second source 148 and a portion of the second drain 150 are respectively disposed under the second spacers 146*b* and 146*c*. In some exemplary examples, each of the second source 148 and the second drain 150 is an epitaxy structure. For example, the second source 148 and the second drain 150 are formed from epitaxial SiGe.

The FinFET structure 120 and the planar FET structure 140 are formed on the same substrate 110, such that the semiconductor device 100 is microminiaturized, thereby increasing the application of the semiconductor device 100.

Figure 2A:
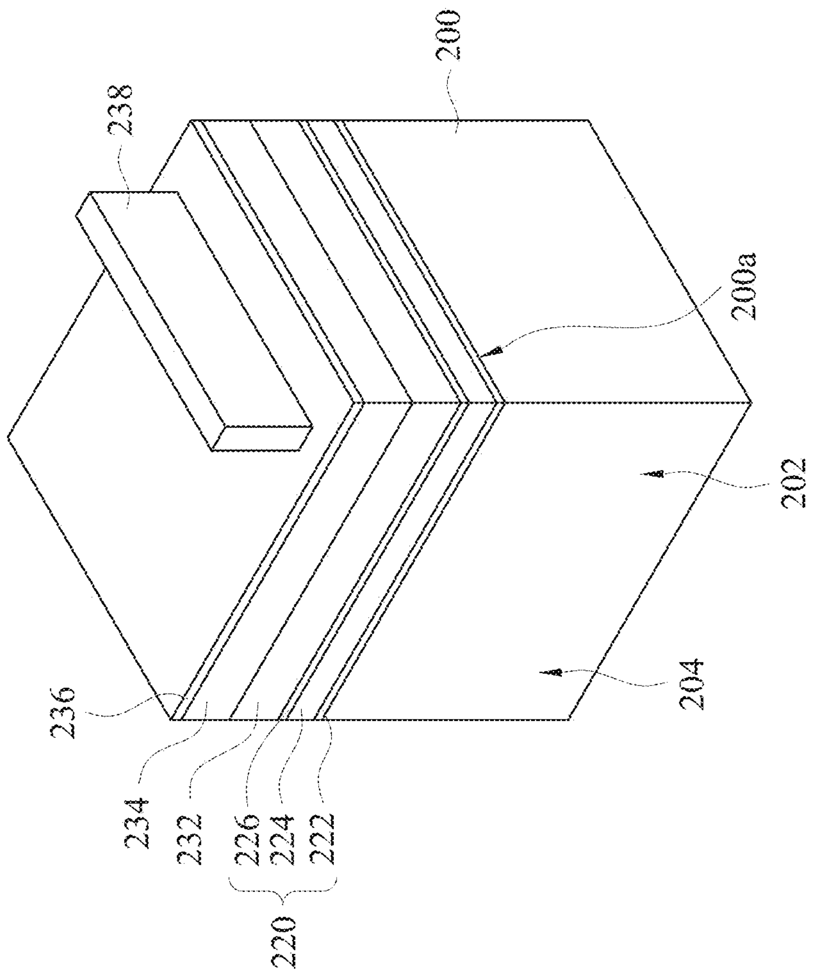
FIG. 2A through FIG. 2J are schematic views of intermediate stages showing a method for manufacturing a semiconductor device in accordance with various embodiments.

FIG. 2A through FIG. 2J are schematic views of intermediate stages showing a method for manufacturing a semiconductor device in accordance with various embodiments. As shown in FIG. 2A, a substrate 200 is provided. The substrate 200 includes a first region 202 and a second region 204. In some examples, the first region 202 is adjacent to the second region 204. The substrate 200 may be composed of a single-crystalline semiconductor material or a compound semiconductor material. For example, silicon, germanium or glass may be used as a material of the substrate 200.

Figure 2B:
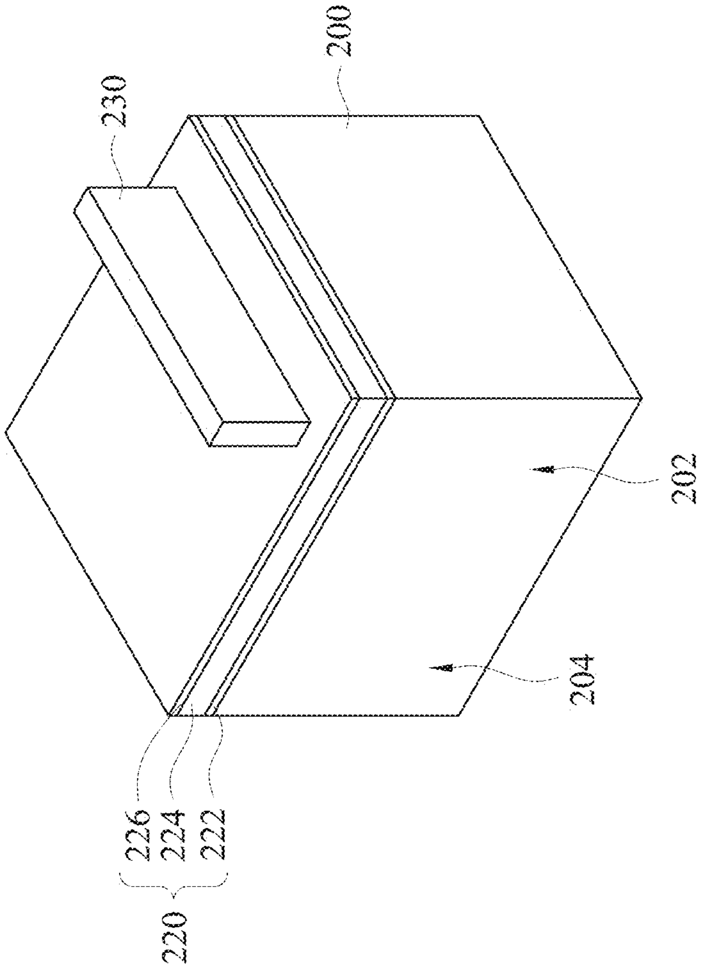
Figure 2C:
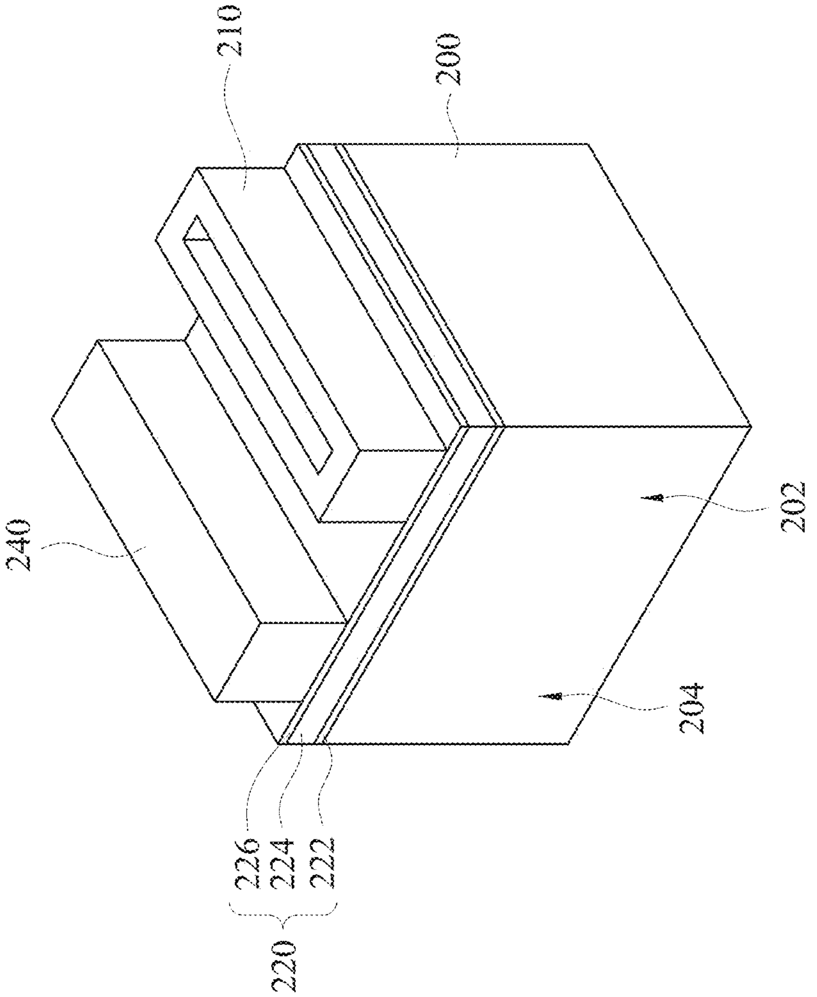

As shown in FIG. 2C, at least one hard mask 210 is formed on the first region 202 of the substrate 200. In some examples, in forming of the hard mask 210, a hard mask structure 220 is formed on a surface 200*a* of the substrate 200. The hard mask structure 220 may be formed to include various layers. For example, as shown in FIG. 2A, forming the hard mask structure 220 may include forming a pad oxide layer 222 on the surface 200*a* of the substrate 200, forming a hard mask layer 224 on the pad oxide layer 222, and forming an oxide layer 226 on the hard mask layer 224. In some exemplary examples, the pad oxide layer 222 is formed from silicon oxide, the mask layer 224 is formed from silicon nitride, and the oxide layer 226 is formed from silicon oxide.

In some examples, as shown in FIG. 2B, in forming of the hard mask 210, after the hard mask structure 220 is completed, after the hard mask structure 220 is completed, at least one fin mandrel 230 is formed on the hard mask structure 220 on the first region 202 of the substrate 200. In some exemplary examples, as shown in FIG. 2A, in forming the fin mandrel 230, a fin mandrel layer 232 is formed on the hard mask structure 220, an anti-reflective film 234 is formed on the fin mandrel layer 232, a protective layer 236 is formed on the anti-reflective film 234, and then an etching mask 238 is formed on a portion of the protective layer 236. Then, an etching operation is performed on the protective layer 236, the anti-reflective film 234, and the fin mandrel layer 232 by using the etching mask 238 to block an etchant, such that a portion of the protective layer 236, a portion of the anti-reflective film 234, and a portion of the fin mandrel layer 232 are removed. After the etching operation is completed, the remaining protective layer 236 and the remaining anti-reflective film 234 are removed, and the remaining fin mandrel layer 232 is left to form the fin mandrel 230. The fin mandrel layer 232 has an etch selectivity related to the hard mask 210. For example, the hard mask 210 may be formed from silicon nitride, and the fin mandrel layer 232 may be formed from polysilicon. The protective layer 236 may be formed from oxynitride, and the etching mask 238 may be formed from photo-resist.

After the forming of the fin mandrel 230 is completed, the hard mask 210 is formed to peripherally enclose the fin mandrel 230. In some exemplary examples, as shown in FIG. 2B and FIG. 2C, the fin mandrel 230 is a bar structure, and the hard mask 210 is a rectangular frame structure. Then, the fin mandrel 230 is removed by an etching process, such as a dry etching process, so as to leave the hard mask 210 on the first region 202 of the substrate 200, as shown in FIG. 2C.

Referring to FIG. 2C again, a mask layer 240 is formed on the hard mask structure 220 on the second region 204 of the substrate 200. In some exemplary examples, the mask layer 240 is formed from photo-resist.

Figure 2D:
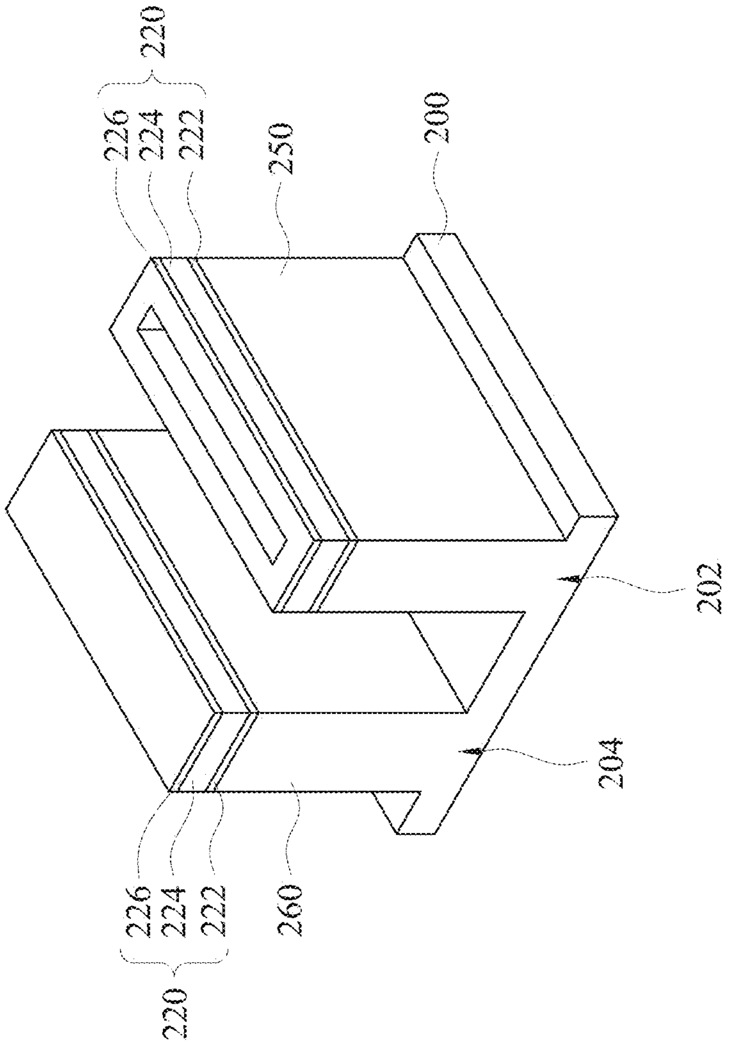

As shown in FIG. 2D, the substrate 200 is recessed by using the hard mask 210 and the mask layer 240 to form a first raised structure 250 in the first region 202 and a second raised structure 260 in the second region 204. In some examples, the substrate 200 is recessed by performing an etching process with the hard mask 210 and the mask layer 240 as etching mask structures, in which the etching process is performed to remove portions of the hard mask structure 220 and portions of the substrate 200, which are not covered by the hard mask 210 and the mask layer 240. The etching process may be a dry etching process or a wet etching process. After the substrate 200 is recessed, the remaining hard mask 210 and the remaining mask layer 240 are removed.

Figure 2E:
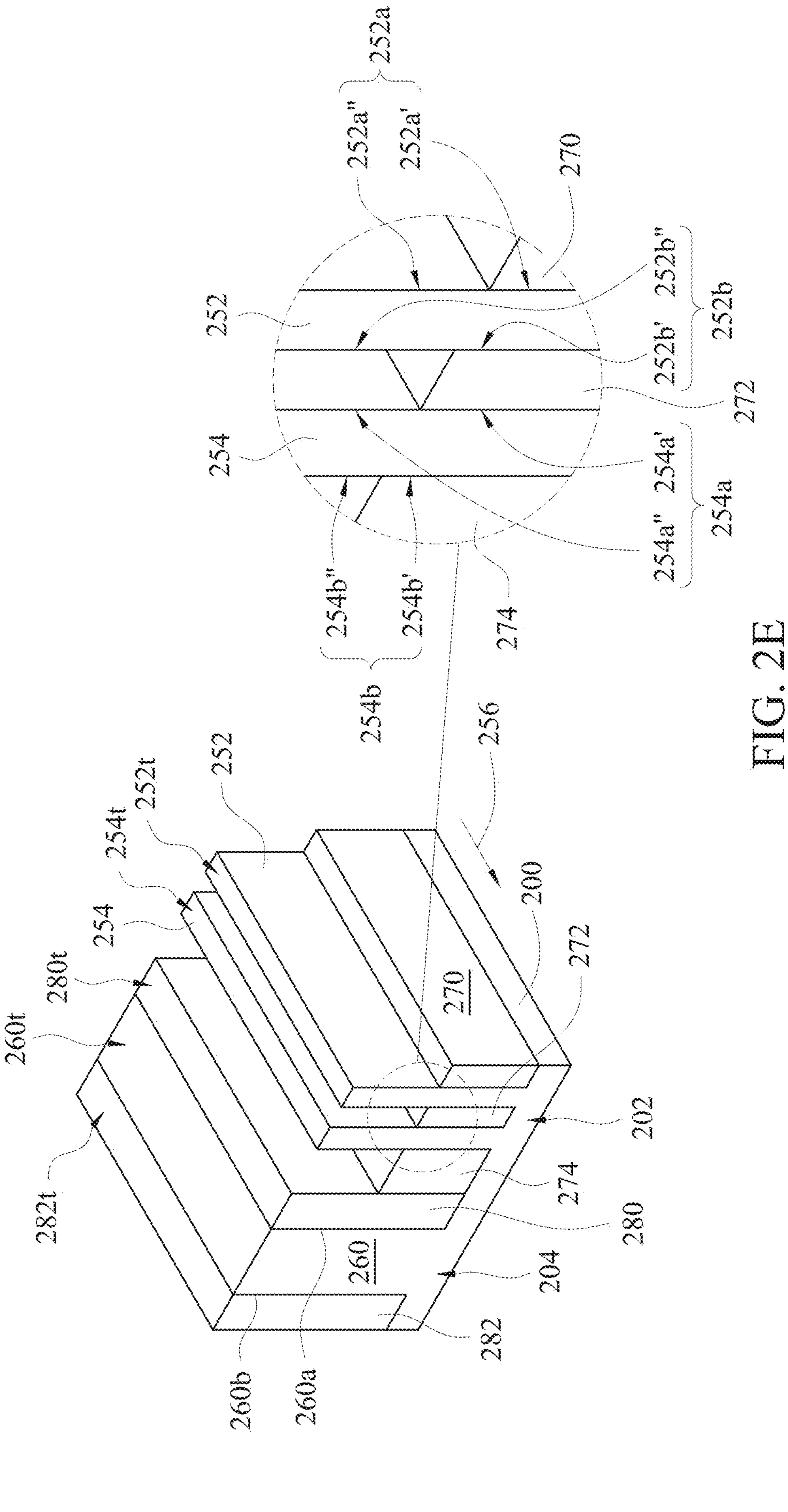

In some examples, at least two first isolation structures and two second isolation structures are formed. For example, as shown in FIG. 2E, three first isolation structures 270, 272, and 274, and two second isolation structures 280 and 282 are formed. In forming the first isolation structures, portions of the first raised structure 250 and portions of the hard mask structure 220 on the portions of the first raised structure 250 are removed to define the first raised structure 250 into at least two fin structures 252 and 254, in which the fin structures 252 and 254 extend along a direction 256. In some exemplary examples, the first isolation structures 270, 272, and 274 extend along the direction 256 that the fin structures 252 and 254 extends along. In addition, lower portions 252*a*' and 252*b*' of two opposite sidewalls 252*a* and 252*b* of the fin structure 252 are covered by the first isolation structures 270 and 272, and lower portions 254*a*' and 254*b*' of two opposite sidewalls 254*a* and 254*b* of the fin structure 254 are covered by the first isolation structures 272 and 274. A top surface 252*t* and upper portions 252*a*" and 252*b*" of the sidewalls 252*a* and 252*b* of the fin structure 252, and a top surface 254*t* and upper portions 254*a*" and 254*b*" of the sidewalls 254*a* and 254*b* of the fin structure 254 are exposed.

In some exemplary examples, the second isolation structures 280 and 282 extend along the direction 256. Two opposite sidewalls 260*a* and 260*b* of the second raised structure 260 are completely covered by the second isolation structures 280 and 282 respectively. In some exemplary examples, a top surface 260*t* of the second raised structure 260 is substantially aligned with a top surface 280*t* of the second isolation structure 280 and a top surface 282*t* of the second isolation structure 282. For example, the first isolation structures 270, 272, and 274, and the second isolation structures 280 and 282 are formed from silicon oxide.

Figure 2F:
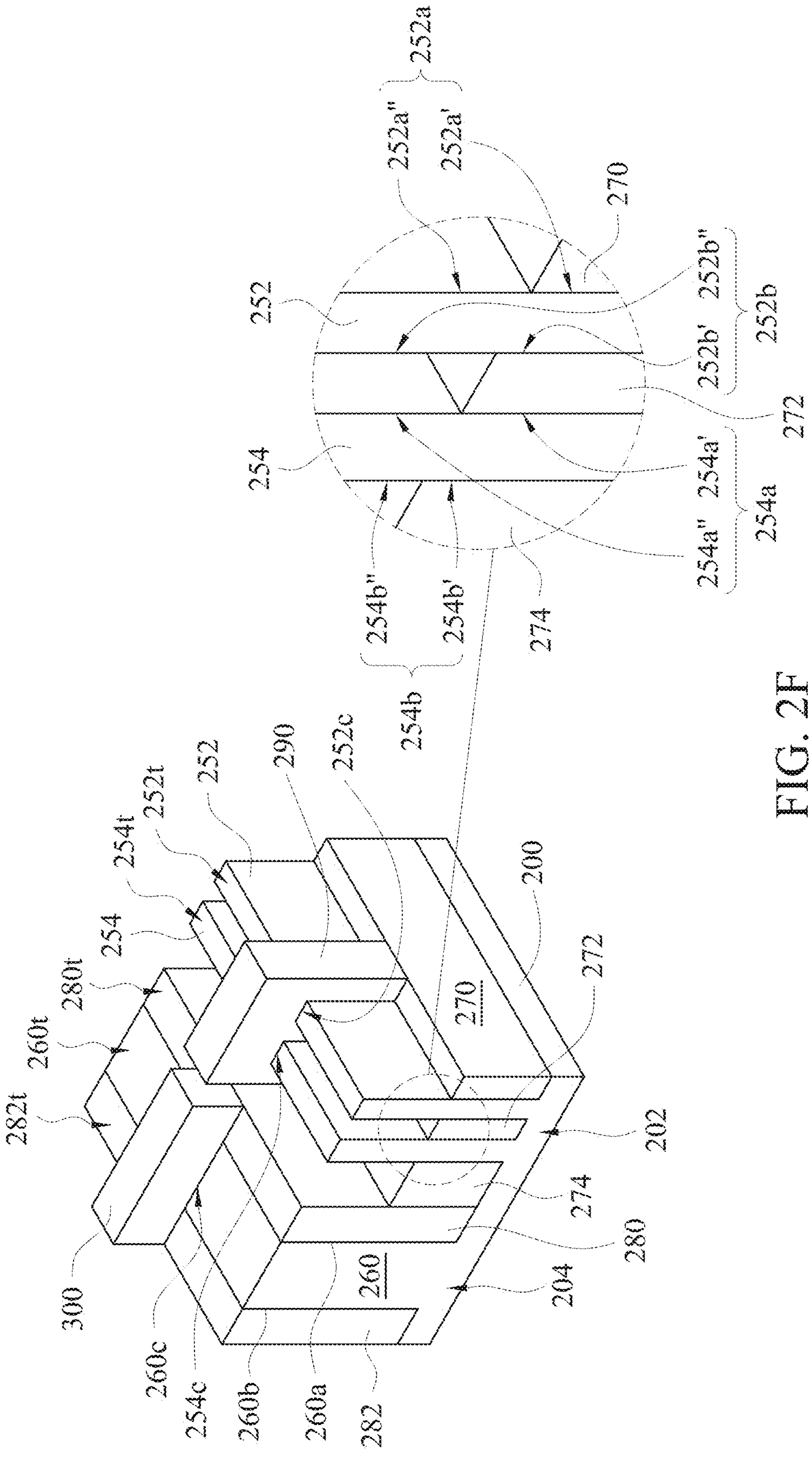

As shown in FIG. 2F, a first dummy gate 290 is formed to extend on a first portion 252*c* of the fin structure 252, a first portion 254*c* of the fin structure 254, and portions of the first isolation structure 270, the first isolation structure 272, and the first isolation structure 274. An extending direction of the first dummy gate 290 is different from the extending direction 256 of the fin structures 252 and 254. For example, the extending direction of the first dummy gate 290 may be perpendicular to the direction 256 of the fin structures 252 and 254. The first dummy gate 290 covers the top surface 252*t* and the upper portions 252*a*" and 252*b*" of the sidewalls 252*a* and 252*b* of the first portion 252*c* of the fin structure 252, and the top surface 254*t* and the upper portions 254*a*" and 254*b*" of the sidewalls 254*a* and 254*b* of the first portion 254*c* of the fin structure 254. Referring to FIG. 2F again, a second dummy gate 300 is formed to extend on a first portion 260*c* of the second raised structure 260, and portions of the second isolation structure 280 and the second isolation structure 282. In some exemplary examples, the first dummy gate 290 and the second dummy gate 300 are formed from polysilicon.

Figure 2G:
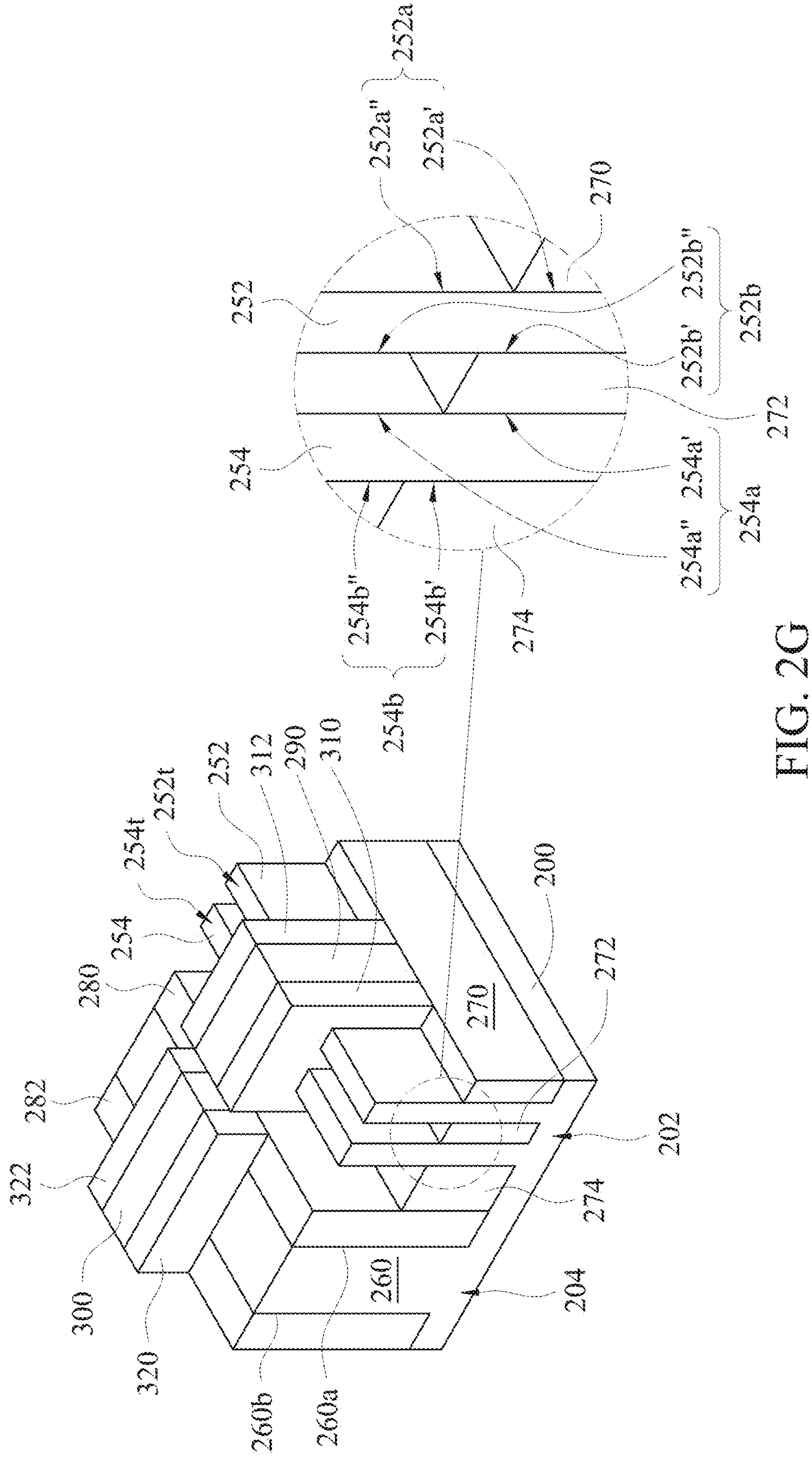

As shown in FIG. 2G, two first spacers 310 and 312 are formed on the fin structures 252 and 254, and the first isolation structures 270, 272, and 274, and are respectively located on two opposite sidewalls of the first dummy gate 290, such that the first dummy gate 290 are sandwiched between the first spacers 310 and 312. Two second spacers 320 and 322 are formed on the raised structure 260, and the second isolation structures 280 and 282, and are respectively located two opposite sidewalls of the second dummy gate 300, such that the second dummy gate 300 are sandwiched between the second spacers 320 and 322. The first spacers 310 and 312 and the second spacers 320 and 322 may be formed from silicon nitride or silicon oxynitride.

Figure 2H:
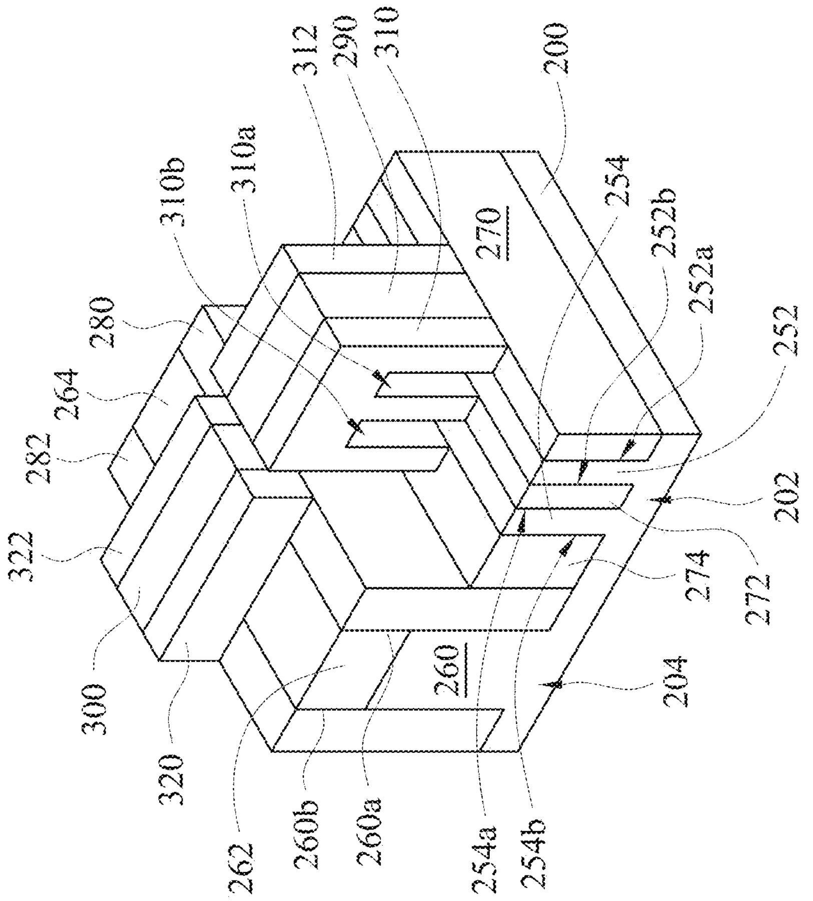

As shown in FIG. 2H, uncovered portions of the fin structures 252 and 254, and portions of the fin structure 252 and 254 covered by the first spacers 310 and 312 are removed, so as to form two holes 310*a* and 310*b* in the first spacer 310 and two holes (not shown in FIG. 2H) in the first spacer 312. The holes formed in the first spacer 312 are similar to the holes 310*a* and 310*b* formed in the first spacer 310. Referring to FIG. 2H again, in some examples, an implantation process may be performed on the second raised structure 260 to form two implantation regions 262 and 264 in the second raised structure 260 and adjacent to two sides of the second dummy gate 300.

Figure 2I:
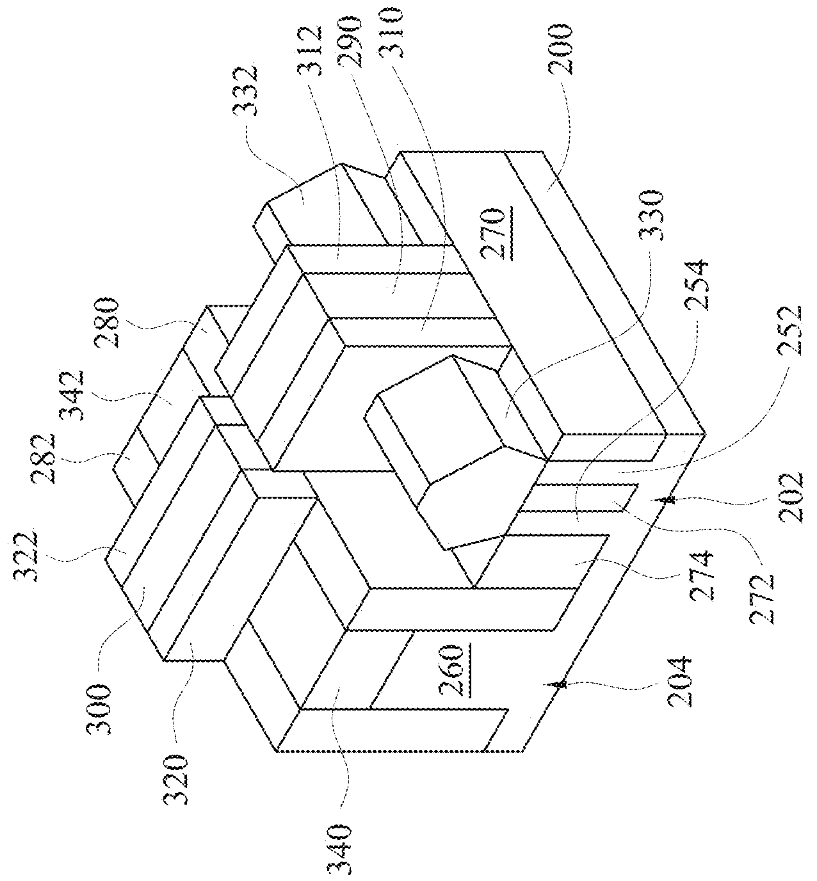

As shown in FIG. 2I, a first source 330, a first drain 332, a second source 340, and a second drain 342 are formed. The first source 330 and the first drain 332 are formed on the fin structures 252 and 254 and are respectively disposed on sidewalls of the first spacers 310 and 312 on two opposite sides of the first dummy gate 290. The first source 330 and the first drain 332 further respectively fill the holes 310*a* and 310*b* formed in the first spacer 310 and the holes formed in the first spacer 312. The second source 340 and the second drain 342 are formed in the implantation regions 262 and 264 in the second raised structure 260 and are respectively adjacent to the second spacers 320 and 322 on two opposite sides of the second dummy gate 300. In some exemplary examples, each of the first source 330, the first drain 332, the second source 340, and the second drain 342 is an epitaxy structure. For example, the first source 330, the first drain 332, the second source 340, and the second drain 342 are formed from epitaxial SiGe.

Figure 2J:
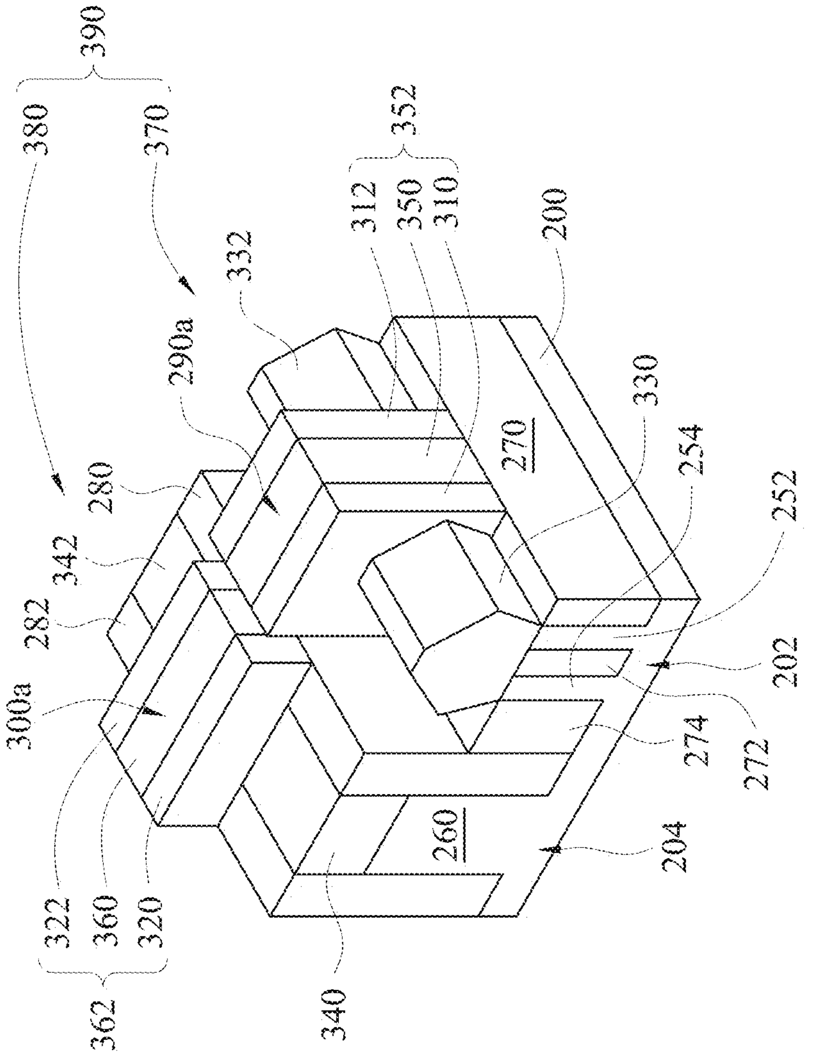

Referring to FIG. 2J, FIG. 2E, and FIG. 2F, the first dummy gate 290 is removed to form a first accommodating space 290*a*, and to expose the upper portions 252*a*" and 252*b*" of the sidewalls 252*a* and 252*b* and the top surface 252*t* of the first portion 252*c* of the fin structure 252 and the upper portions 254*a*" and 254*b*" of the sidewalls 254*a* and 254*b* and the top surface 254*t* of the first portion 254*c* of the fin structure 254. In addition, the second dummy gate 300 is removed to form a second accommodating space 300*a*, and to expose the top surface 260*t* of the first portion 260*c* of the second raised structure 260. Then, the first accommodating space 290*a* is filled with a first gate 350 to complete a first gate structure 352, so as to substantially complete a FinFET structure 370. The first gate structure 352 includes the first spacers 310 and 312 and the first gate 350. The first gate 350 includes a metal layer. The second accommodating space 300*a* is filled with a second gate 360 to complete a second gate structure 362, so as to substantially complete a planar FET structure 380. The second gate structure 362 includes the second spacers 320 and 322 and the second gate 360. The second gate 360 includes a metal layer. Thus, a semiconductor device 390 including the FinFET structure 370 and the planar FET structure 380 is substantially completed.

After the hard mask 210 used to define the first raised structure 250 of the FinFET structure 370 is completed, the mask layer 240 for defining the second raised structure 260 of the planar FET structure 380 is additionally formed on the second region 204 of the substrate 200, such that the FinFET structure 370 and the planar FET structure 380 can be simultaneously manufactured on the substrate 200. Thus, the process of manufacturing the semiconductor device 390 is simplified, and the semiconductor device 390 is microminiaturized.

Figure 3:
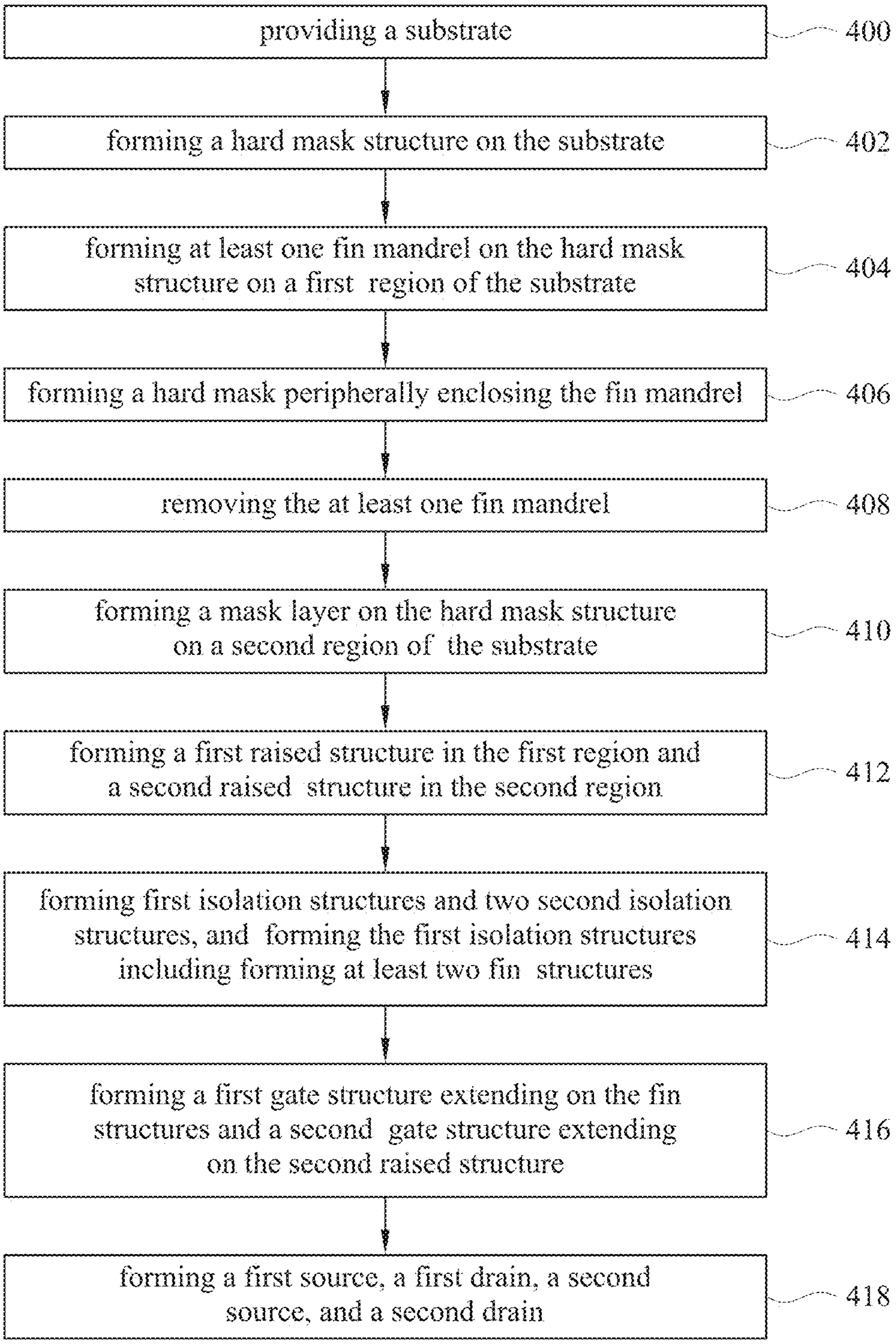
FIG. 3 is a flow chart of a method for manufacturing a semiconductor device in accordance with various embodiments.

Referring to FIG. 3 with FIG. 2A through FIG. 2J, FIG. 3 is a flow chart of a method for manufacturing a semiconductor device in accordance with various embodiments. The method begins at operation 400, where a substrate 200 is provided, as shown in FIG. 2A. The substrate 200 includes a first region 202 and a second region 204. The first region 202 may be adjacent to the second region 204. For example, silicon, germanium or glass may be used as a material of the substrate 200.

At operation 402, as shown in FIG. 2A, a hard mask structure 220 is formed on a surface 200*a* of the substrate 200. The hard mask structure 220 may be formed to include various layers. For example, in forming the hard mask structure 220, a pad oxide layer 222 is formed on the surface 200*a* of the substrate 200, a hard mask layer 224 is formed on the pad oxide layer 222, and an oxide layer 226 is formed on the hard mask layer 224. In some exemplary examples, the pad oxide layer 222 is formed by using a thermal oxidization technique or a deposition technique, such as a chemical vapor deposition (CVD) technique and physical vapor deposition (PVD) technique. The hard mask layer 224 and the oxide layer 226 may be formed by using a deposition technique, such as a chemical vapor deposition technique or a physical vapor deposition technique.

At operation 404, as shown in FIG. 2B, at least one fin mandrel 230 is formed on the hard mask structure 220 on the first region 202 of the substrate 200. In some exemplary examples, as shown in FIG. 2A, in forming the fin mandrel 230, a fin mandrel layer 232 is formed on the hard mask structure 220, an anti-reflective film 234 is formed on the fin mandrel layer 232, a protective layer 236 is formed on the anti-reflective film 234, and then an etching mask 238 is formed on a portion of the protective layer 236. For example, the fin mandrel layer 232, the anti-reflective film 234, and the protective layer 236 may be formed by using a deposition technique, such as a chemical vapor deposition technique or a physical vapor deposition technique. The etching mask 238 may be formed by performing a spin-coating process and a photolithography process. Then, an etching operation is performed on the protective layer 236, the anti-reflective film 234, and the fin mandrel layer 232 by using the etching mask 238 to block an etchant, such that a portion of the protective layer 236, a portion of the anti-reflective film 234, and a portion of the fin mandrel layer 232 are removed. After the etching operation is completed, the remaining protective layer 236 and the remaining anti-reflective film 234 are removed, and the remaining fin mandrel layer 232 is left to form the fin mandrel 230.

At operation 406, a hard mask 210 is formed to peripherally enclose the fin mandrel 230. The hard mask 210 may be formed by using a deposition technique, a photolithography technique, and an etching technique. In some exemplary examples, as shown in FIG. 2B and FIG. 2C, the fin mandrel 230 is a bar structure, and the hard mask 210 is a rectangular frame structure. The hard mask 210 has an etch selectivity related to the fin mandrel layer 232. For example, the hard mask 210 may be formed from silicon nitride, and the fin mandrel layer 232 may be formed from polysilicon. At operation 408, as shown in FIG. 2C, the fin mandrel 230 is removed by an etching process, such as a dry etching process, so as to leave the hard mask 210 on the first region 202 of the substrate 200.

At operation 410, referring to FIG. 2C again, a mask layer 240 is formed on the hard mask structure 220 on the second region 204 of the substrate 200. In some exemplary examples, the mask layer 240 is formed from photo-resist, and the mask layer 240 is formed by performing a spin-coating process and a photolithography process.

At operation 412, as shown in FIG. 2D, the substrate 200 is recessed to form a first raised structure 250 in the first region 202 and a second raised structure 260 in the second region 204. In some examples, the substrate 200 is recessed by performing an etching process with the hard mask 210 and the mask layer 240 as etching mask structures. The etching process is performed to remove portions of the hard mask structure 220 and portions of the substrate 200, which are not covered by the hard mask 210 and the mask layer 240. The etching process may be a dry etching process or a wet etching process. After the substrate 200 is recessed, the remaining hard mask 210 and the remaining mask layer 240 are removed.

At operation 414, at least two first isolation structures and two second isolation structures are formed. For example, as shown in FIG. 2E, three first isolation structures 270, 272, and 274, and two second isolation structures 280 and 282 are formed. In forming the first isolation structures, portions of the first raised structure 250, and portions of the hard mask structure 220 on the portions of the first raised structure 250 are removed to define the first raised structure 250 into at least two fin structures 252 and 254. The fin structures 252 and 254 are formed to extend along a direction 256. In some exemplary examples, the first isolation structures 270, 272, and 274 extend along the direction 256. Lower portions 252*a*' and 252*b*' of two opposite sidewalls 252*a* and 252*b* of the fin structure 252 are covered by the first isolation structures 270 and 272, and lower portions 254*a*' and 254*b*' of two opposite sidewalls 254*a* and 254*b* of the fin structure 254 are covered by the first isolation structures 272 and 274. In addition, a top surface 252*t* and upper portions 252*a*" and 252*b*" of the sidewalls 252*a* and 252*b* of the fin structure 252, and a top surface 254*t* and upper portions 254*a*" and 254*b*" of the sidewalls 254*a* and 254*b* of the fin structure 254 are exposed.

In some examples, the second isolation structures 280 and 282 extend along the direction 256. Two opposite sidewalls 260*a* and 260*b* of the second raised structure 260 are completely covered by the second isolation structures 280 and 282 respectively. In some exemplary examples, a top surface 260*t* of the second raised structure 260 is substantially aligned with a top surface 280*t* of the second isolation structure 280 and a top surface 282*t* of the second isolation structure 282. For example, the first isolation structures 270, 272, and 274, and the second isolation structures 280 and 282 are formed by using a high-density plasma chemical vapor deposition (HDP CVD) technique.

At operation 416, referring to FIG. 2J firstly, a first gate structure 352 is formed to extend on the fin structures 252 and 254, and a second gate structure 362 is formed to extend on the second raised structure 260. In some examples, as shown in FIG. 2F, in forming the first gate structure 352, a first dummy gate 290 is formed to extend on a first portion 252*c* of the fin structure 252, a first portion 254*c* of the fin structure 254, and portions of the first isolation structure 270, the first isolation structure 272, and the first isolation structure 274. The first dummy gate 290 is formed to have an extending direction which is different from the extending direction 256 of the fin structures 252 and 254. For example, the extending direction of the first dummy gate 290 may be perpendicular to the direction 256. The first dummy gate 290 is formed to cover the top surface 252*t* and the upper portions 252*a*" and 252*b*" of the sidewalls 252*a* and 252*b* of the first portion 252*c* of the fin structure 252, and the top surface 254*t* and the upper portions 254*a*" and 254*b*" of the sidewalls 254*a* and 254*b* of the first portion 254*c* of the fin structure 254. In forming the second gate structure 362, a second dummy gate 300 is formed to extend on a first portion 260*c* of the second raised structure 260, and portions of the second isolation structure 280 and the second isolation structure 282. In some exemplary examples, the first dummy gate 290 and the second dummy gate 300 are formed by using a deposition technique, a photolithography technique, and an etching technique.

As shown in FIG. 2G, in forming the first gate structure 352, after the first dummy gate 290 is formed, two first spacers 310 and 312 are formed on the fin structures 252 and 254, and the first isolation structures 270, 272, and 274, and are respectively located on two opposite sidewalls of the first dummy gate 290. In forming the second gate structure 352, after the second dummy gate 300 is formed, two second spacers 320 and 322 are formed on the raised structure 260, and the second isolation structures 280 and 282, and are respectively located two opposite sidewalls of the second dummy gate 300. The first spacers 310 and 312 and the second spacers 320 and 322 may be formed by using a deposition technique and an etching back technique.

In forming the first gate structure 352, referring to FIG. 2J, FIG. 2E, and FIG. 2F simultaneously, the first dummy gate 290 is removed to form a first accommodating space 290*a*, and to expose the upper portions 252*a*" and 252*b*" of the sidewalls 252*a* and 252*b* and the top surface 252*t* of the first portion 252*c* of the fin structure 252 and the upper portions 254*a*" and 254*b*" of the sidewalls 254*a* and 254*b* and the top surface 254*t* of the first portion 254*c* of the fin structure 254. In forming the second gate structure 362, the second dummy gate 300 is removed to form a second accommodating space 300*a*, and to expose the top surface 260*t* of the first portion 260*c* of the second raised structure 260. Then, the first accommodating space 290*a* is filled with a first gate 350 to complete a first gate structure 352, so as to substantially complete a FinFET structure 370. The second accommodating space 300*a* is filled with a second gate 360 to complete a second gate structure 362, so as to substantially complete a planar FET structure 380. The first gate structure 352 includes the first spacers 310 and 312 and the first gate 350, in which the first gate 350 includes a metal layer. The second gate structure 362 includes the second spacers 320 and 322 and the second gate 360, in which the second gate 360 includes a metal layer.

At operation 418, as shown in FIG. 2H, between forming the first spacers 310 and 312 and the second spacers 320 and 322, and filling the first accommodating space 290*a* and the second accommodating space 300*a* with the first gate 350 and the second gate 360, a first source 330, a first drain 332, a second source 340, and a second drain 342 are formed. In forming the first source 330 and the first drain 332, uncovered portions of the fin structures 252 and 254, and portions of the fin structure 252 and 254 covered by the first spacers 310 and 312 are removed by using an etching technique, so as to form two holes 310*a* and 310*b* in the first spacer 310 and two holes (not shown in FIG. 2H) in the first spacer 312. The first source 330 and the first drain 332 are formed on the fin structures 252 and 254 and are respectively disposed on sidewalls of the first spacers 310 and 312 on two opposite sides of the first dummy gate 290. The first source 330 and the first drain 332 further respectively fill the holes 310*a* and 310*b* formed in the first spacer 310 and the holes formed in the first spacer 312. For example, the first source 330 and the first drain 332 may be formed by using an epitaxy technique.

Referring to FIG. 2H again, in some examples, in forming the second source 340 and the second drain 342, an implantation process may be performed on the second raised structure 260 to form two implantation regions 262 and 264 in the second raised structure 260 and adjacent to two sides of the second dummy gate 300. The second source 340 and the second drain 342 are formed in the implantation regions 262 and 264 in the second raised structure 260 and are respectively adjacent to the second spacers 320 and 322 on two opposite sides of the second dummy gate 300. For example, the second source 340 and the second drain 342 may be formed by using an epitaxy technique. Thus, after the first accommodating space 290*a* and the second accommodating space 300*a* are respectively filled with the first gate 350 and the second gate 360, a semiconductor device 390 including the FinFET structure 370 and the planar FET structure 380 is substantially completed.

In accordance with some embodiments, a device includes first and second transistors and first and second isolation structures. The first transistor includes an active region including a first channel region, a first source and a first drain in the active region and respectively on opposite sides of the first channel region, and a first gate structure over the first channel region. The first isolation structure surrounds the active region of the first transistor. A top of the first isolation structure is substantially aligned with a top of the first channel region. The second transistor includes a second source and a second drain, a fin structure including a second channel region between the second source and the second drain, and a second gate structure over the second channel region. The second isolation structure surrounds a bottom portion of the fin structure of the second transistor. The top of the first isolation structure is higher than a top of the second isolation structure.

In accordance with some embodiments, a device includes first and second transistors and first and second isolation structures. The first transistor includes an active region including a first channel region, a first source and a first drain in the active region of the first transistor and respectively on opposite sides of the first channel region, and a first gate structure over the first channel region. The first isolation structure surrounds the active region of the first transistor. A top of the first isolation structure is substantially aligned with a top of the first channel region. The second transistor includes a second source and a second drain, a fin structure including a second channel region between the second source and the second drain, and a second gate structure over the second channel region. The second isolation structure surrounds a bottom portion of the fin structure of the second transistor. A top of the second channel region is substantially aligned with the top of the first channel region. The top of the second channel region is higher than a top of the second isolation structure.

In accordance with some embodiments, a device includes first and second transistors and first and second isolation structures. The first transistor includes an active region including a first channel region, a first source and a first drain in the active region and respectively on opposite sides of the first channel region, and a first gate structure over the first channel region. The first isolation structure surrounds the active region of the first transistor. A top of the first isolation structure is substantially aligned with a top of first channel region. The second transistor includes a second source and a second drain, a fin structure including a second channel region between the second source and the second drain, and a second gate structure over the second channel region. A bottom of the first drain is higher than a bottom of the second drain. The second isolation structure surrounds a bottom portion of the fin structure of the second transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:

a first transistor on a first region of a substrate, the first transistor comprising a first gate structure over the first region, a first source and a first drain on opposite sides of the first gate structure;

a second transistor on a second region of the substrate, the second transistor comprising a second gate structure over a protruding structure protruding from the second region of the substrate, a second source and a second drain on opposite sides of the second gate structure;

a first gate spacer on a sidewall of the second gate structure with a bottommost surface on the second source, wherein a bottommost surface of the first source is higher than the bottommost surface of the first gate spacer;

a first dielectric region directly below the first gate structure; and a second dielectric region directly below the second gate structure, wherein the first dielectric region is continuous with the second dielectric region, wherein the first dielectric region has a top surface higher than a top surface of the second dielectric region and lower than an entirety of a top surface of the second gate structure.

2. The device of claim 1, wherein the first dielectric region has a bottommost surface lower than a bottommost surface of the first source.

3. The device of claim 1, wherein the first transistor is a planar transistor.

4. The device of claim 1, wherein the second transistor is a fin-type transistor.

5. The device of claim 1, wherein the second source has a greater width variation than the first source.

6. The device of claim 1, wherein a side surface of the second source is inclined with respect to a side surface of the first source.

7. The device of claim 6, wherein the side surface of the first source is vertical.

8. The device of claim 1, wherein the second source and the second drain are epitaxial structures.

9. The device of claim 1, wherein a side surface of the second source exhibits a change in slope at a level height lower than the top surface of the first dielectric region.

10. A device, comprising:

a non-planar field effect transistor (FET) on a first region of a substrate, the non-planar FET comprising a first source region, a first drain region, a first gate between the first source region and the first drain region, and a first gate spacer on a sidewall of the first gate;

a planar-FET on a second region of the substrate, the planar-FET comprising a second source region, a second drain region, and a second gate between the second source region and the second drain region, wherein a bottommost position of the first source region is lower than a bottommost position of the second source region;

a first dielectric region directly below the first gate of the non-planar FET; and a second dielectric region directly below the second gate of the planar-FET, wherein the second dielectric region is continuous with the first dielectric region, and a top surface of the second dielectric region is higher than a top surface of the first dielectric region by a height difference, and the height difference is smaller than a height of the first gate spacer.

11. The device of claim 10, wherein the planar-FET further comprises a second gate spacer on a sidewall of the second gate, and the height difference between the top surface of the second dielectric region and the top surface of the first dielectric region is larger than a height of the second gate spacer.

12. The device of claim 10, wherein the top surface of the second dielectric region is lower than an entirety of a top surface of the first gate spacer.

13. The device of claim 10, wherein the non-planar FET is a FinFET.

14. The device of claim 10, wherein from a cross-sectional view taken along a longitudinal direction of the first gate, the first source region of the non-planar FET has a profile different from a profile of the second source region of the planar-FET.

15. The device of claim 10, wherein the first source region of the non-planar FET has a bottommost point lower than a bottommost point of the second source region of the planar-FET.

16. The device of claim 10, wherein the height difference between the top surface of the second dielectric region and the top surface of the first dielectric region is greater than a depth of the second source region of the planar-FET.

17. A device, comprising:

a first transistor on a substrate, and comprising first source/drain regions, a first channel region between the first source/drain regions, and a first gate on multiple sides of the first channel region;

a second transistor on the substrate, and comprising second source/drain regions, a second channel region between the second source/drain regions, and a second gate on a top side of the second channel region;

a first gate spacer spacing the first gate from one of the first source/drain regions;

a second gate spacer spacing the second gate from one of the second source/drain regions, wherein the second gate spacer has a bottom surface higher than a bottom surface of the first gate spacer; and an isolation structure between the first transistor and the second transistor, the isolation structure having a stepped top surface having a higher region, a lower region lower than the higher region, and a step rise surface extending upwards from the lower region to the higher region, wherein the second gate has an end surface aligned with the step rise surface of the stepped top surface of the isolation structure.

18. The device of claim 17, wherein the step rise surface of the stepped top surface of the isolation structure has a height greater than a height of the second gate spacer.

19. The device of claim 17, wherein the step rise surface of the stepped top surface has a height greater than a depth of one of the second source/drain regions.

20. The device of claim 17, wherein the second transistor is a planar transistor.

* * * * *